United States Patent
Kano

(10) Patent No.: US 6,420,727 B1
(45) Date of Patent: Jul. 16, 2002

(54) LIGHT-EMITTING SEMICONDUCTOR DEVICE WITH QUANTUM-WAVE INTERFERENCE LAYERS

(75) Inventor: Hiroyuki Kano, Aichi-ken (JP)

(73) Assignee: Canare Electric Co., Ltd., Aichi-gun (JP)

( * ) Notice: Subject to any disclaimer, the term of this patent is extended or adjusted under 35 U.S.C. 154(b) by 16 days.

(21) Appl. No.: 09/669,855

(22) Filed: Sep. 27, 2000

(30) Foreign Application Priority Data

Sep. 29, 1999 (JP) .......................................... 11-277496

(51) Int. Cl.$^7$ .............................................. H01L 33/00
(52) U.S. Cl. ............................ 257/13; 257/15; 257/17; 257/26; 257/29; 257/97
(58) Field of Search .............................. 257/9, 12–15, 257/17–19, 21–23, 25, 26, 29, 79, 94, 96, 97

(56) References Cited

U.S. PATENT DOCUMENTS 5,737,350 A * 4/1998 Motoda et al. ................ 372/45
6,097,041 A * 8/2000 Lin ............................... 257/98

OTHER PUBLICATIONS

Guthrie et al., "Measurement of the zero–bias electron transmittance as a function of energy for half–and quaroter–electron–wavelength semiconductor quantum–interference filters," Jan. 19, 1998, Appl. Phys. Lett. 72(3), pp. 374–376.*
U.S. application No. 09/669,855, filed Sep. 27, 2000, pending.
U.S. application No. 09/915,384, Jul. 27, 2001, pending.
U.S. application No. 09/699,855, filed Sep. 27, 2000, pending.
U.S. application No. 09/688,201, filed Oct. 16, 2000, pending.
U.S. application No. 09/695,312, filed Oct. 25, 2000, pending.
U.S. application No. 09/057,549, filed Apr. 9, 1998, allowed.
U.S. application No. 09/064,222, filed Apr. 22, 1998, allowed.
U.S. application No. 09/059,374, filed Apr. 14, 1998, allowed.

(List continued on next page.)

Primary Examiner—Eddie Lee
Assistant Examiner—Bradley William Baumeister
(74) Attorney, Agent, or Firm—Oblon, Spivak, McClelland, Maier & Neustadt, P.C.

(57) ABSTRACT

A light-emitting device comprising an emission layer which has a single layer structure is formed. The emission layer is sandwiched by a first quantum-wave interference layer constituted by plural periods of a pair of a first layer and a second layer, the second layer having a wider band gap than the first layer, and a second quantum-wave interference layer constituted by plural periods of a pair of a third layer and a fourth layer, the fourth layer having a wider band gap than the third layer. The first quantum-wave interference layer functions as an electron reflection layer, and its thickness is determined by multiplying by an odd number one fourth of quantum-wave wavelength of the injected electrons. The second quantum-wave interference layer functions as an electron transmission layer, and its thickness is determined by multiplying by an odd number one fourth of quantum-wave wavelength of the injected electrons. As a result, luminous efficiency of the device is improved. A barrier layer is formed at each interfaces between the first quantum-wave interference layer, the emission layer, and the second quantum-wave interference layer. As a result, generation of electron-hole pairs is improved.

10 Claims, 11 Drawing Sheets

OTHER PUBLICATIONS

U.S. application No. 09/245,299, filed Feb. 5, 1999, pending.
U.S. application No. 09/296,743, filed Apr. 23, 1999, pending.
U.S. application No. 09/300,389, filed Apr. 27, 1999, pending.
U.S. application No. 09/320,510, filed May 26, 1999, pending.
U.S. application No. 09/421,221, filed Oct. 20, 1999, pending.
U.S. application No. 09/422,078, filed Oct. 21, 1999, pending
U.S. application No. 09/425,737, filed Oct. 22, 1999, pending.
U.S. application No. 09/425,735, filed Oct. 22, 1999, pending.
U.S. application No. 09/425,685, filed Oct. 22, 1999, pending.
U.S. application No. 09/461,331, filed Dec. 15, 1999, pending.
U.S. application No. 09/461,756, filed Dec. 16, 1999, pending.
U.S. application No. 09/636,081, filed Aug. 11, 2000, pending.
U.S. application No. 09/645,931, filed Aug. 25, 2000, pending.
U.S. application No. 09/648,367, filed Aug. 25, 2000, pending.
U.S. application No. 09/645,932, filed Aug. 25, 2000, pending.
U.S. application No. 09/699,855, filed Sep. 27, 2000, pending.

* cited by examiner

LIGHT-EMITTING SEMICONDUCTOR DEVICE WITH QUANTUM-WAVE INTERFERENCE LAYERS

BACKGROUND OF THE INVENTION

1. Field of the Invention

The present invention relates to a light-emitting semiconductor device with a quantum-wave interference layer which reflects carriers, i.e., electrons or holes, effectively, and with a quantum-wave interference layer which transmits carriers, i.e., electrons or holes, effectively. Especially, the present invention relates to a light-emitting semiconductor device such as a laser or a light-emitting diode with a structure which confines carriers in an emission layer so as to improve its luminous efficiency.

2. Description of the Related Art

A semiconductor device has been known to have a double hetero junction structure whose active layer is formed between n-type and p-type cladding layers. The cladding layers function as potential barriers for effectively confining carriers, or electrons and holes, within the active layer.

However, a problem persists in luminous efficiency. Carriers overflow the potential barriers of the cladding layers, which lowers luminous efficiency. Therefore, further improvement has been required, as presently appreciated by the present inventors.

As a countermeasure, forming cladding layers having a multiple quantum well structure of a first and a second layer as a unit in a laser diode in order to reflect carriers has been suggested by Takagi et al. (Japanese Journal of Applied Physics. Vol. 29, No.11, November 1990, pp.L1977–L1980). This reference, however, does not teach or suggest values of kinetic energy of carriers to be considered.

SUMMARY OF THE INVENTION

The inventor of the present invention conducted a series of experiments and found that, although it can be understood that Takagi et al. used a band gap energy alternative to a kinetic energy, the suggested thickness of the first and the second layers by Takagi et al. were too small to confine electrons, and that preferable thicknesses of the first and second layers are 4 to 6 times larger than those suggested by Takagi et al. So a problem still persisted in inadequacy of reflecting carriers.

Further, the present inventor thought that multiple quantum-wave reflection of carriers might occur by a multiple layer structure with different band width, like multiple light reflection by a dielectric multi-film structure. And the inventor thought that it would be possible to confine carriers by the reflection of the quantum-wave interference layer and filed an application with respect to this (Japanese Patent Application laid-open No. H10-303406).

Then the inventor of the present invention concerned a characteristic of electrons as a wave and considered that the quantum-wave interference layer functions as a transmission layer of carriers, by analogy with the multiple reflection of the light. That is, when each thickness of layers in the multiple layer structure is about an order of the wavelength of a quantum-wave of carriers, an interference effect of quantum-wave is considered to occur with respect to a conduction of carriers in the multiple layer structure. The interference effect caused a conduction as a wave. Accordingly, the inventor of the present invention considered that not a conduction of particle in a classical theory but a resonance of waves, an interference, or other phenomenon is occurred by an interference effect of electrons. This wave behavioral characteristic of electrons improves a mobility and a propagation velocity.

Then the inventor of the present invention combined a reflection layer and a transmission layer of carriers and formed an emission layer between the reflection layer and the transmission layer in a light-emitting semiconductor device. Accordingly, the inventor of the present invention obtained a light-emitting semiconductor device having a completely new structure.

It is, therefore, an object of the present invention is to provide a semiconductor device with a new structure, having both a quantum-wave interference layer with a large reflectivity to carriers which functions as a reflection layer and a quantum-wave interference layer with a high transmittivity and a high mobility to carriers which functions as a transmission layer.

In light of these objects a first aspect of the present invention is a light-emitting semiconductor device constituted by a first quantum-wave interference layer having plural periods of a pair of a first layer and a second layer, the second layer having a wider band gap than the first layer, a second quantum-wave interference layer having plural periods of a pair of a third layer and a fourth layer, the fourth-layer having a wider band gap than the third layer, and an emission layer formed between the first and the second quantum-wave interference layers. Each thickness of the first and the second layers in the first quantum-wave interference layer is determined by multiplying by an odd number one fourth of a quantum-wave wavelength of carriers in each of the first and the second layers, each thickness of the third and the fourth layers in the second quantum-wave interference layer is determined by multiplying by an even number one fourth of a quantum-wave wavelength of carriers in each of the third and the fourth layers, and the thickness of the emission layer is determined by multiplying by an odd number one fourth of a quantum-wave wavelength of carriers in the emission layer. Here the emission layer formed between the first and the second quantum-wave interference layers may not contact to either the first or the second quantum-wave interference layers, or it may contact to both of the first and the second quantum-wave interference layers. Other semiconductor layers can exist at interfaces between the emission layer and the first quantum-wave interference layer and between the emission layer and the second quantum-wave interference layer.

A second aspect of the present invention is to form each thickness of the first and the second layers in the first quantum-wave interference layer by multiplying by an odd number one fourth of quantum-wave wavelength of carriers in each of the first and the second layers existing at the level near the lowest energy level of the second layer and to form each thickness of the third and the fourth layers in the second quantum-wave interference layer by multiplying an even number one fourth of quantum-wave wavelength of carriers in each of the third and the fourth layers existing at the level near the lowest energy level of the fourth layer. The thickness of the emission layer is determined by multiplying by an odd number one fourth of quantum-wave wavelength of carriers in the emission layer existing at the level near the lowest energy level of a layer which has a wider band gap and is adjacent to the emission layer. Here carriers transmit through the layer adjacent to the emission layer when the emission layer has a single layer structure, and when the emission layer has a single quantum well (SQW) structure or a multiple quantum well (MQW) structure, the layers adjacent to the emission layer are barrier layers formed on the both side of the emission layer.

A third aspect of the present invention is to form a $\delta_R$ layer, which varies an energy band sharply, at an interface between the first and the second layers. A thickness of the $\delta_R$ layer is substantially thinner than that of the first and the second layers.

A fourth aspect of the present invention is to form a $\delta_T$ layer, which varies an energy band sharply, at an interface between the third and the fourth layers. A thickness of the $\delta_T$ layer is substantially thinner than that of the third and the fourth layers.

A fifth aspect of the present invention is to define each thickness of the first and the second layers as follows:

$$D_{RW}=n_{RW}\lambda_{RW}/4=n_{RW}h/4[2m_{RW}(E_R+V_R)]^{1/2} \qquad (1\text{-}1)$$

and $$D_{RB}=n_{RB}\lambda_{RB}/4=n_{RB}h/4(2m_{RB}E_R)^{1/2} \qquad (1\text{-}2)$$

In Eqs. 1-1 and 1-2, h, $m_{RW}$, $m_{RB}$, $E_R$, $V_R$, and $n_{RW}$, $n_{RB}$ represent Plank's constant, the effective mass of carriers in the first layer, the effective mass of carriers in the second layer, the kinetic energy of the carriers injected into the second layer, the potential energy of the second layer relative to the first layer, and odd numbers, respectively. Carriers injected into the second layer preferably exist around the lowest energy level of the second layer.

A sixth aspect of the present invention is to form a barrier layer between the first quantum-wave interference layer and the emission layer. The barrier layer has an enough thickness which is determined by multiplying an even number one fourth of quantum-wave wavelength of carriers transmitting in the barrier layer.

A seventh aspect of the present invention is to define each thickness of the third and the fourth layers as follows:

$$D_{TW}=n_{TW}\lambda_{TW}/4=n_{TW}h/4[2m_{TW}(E_T+V_T)]^{1/2} \qquad (2\text{-}1)$$

and $$D_{TB}=n_{TB}\lambda_{TB}/4=n_{TB}hv/4(2m_{TB}E_T)^{1/2} \qquad (2\text{-}2)$$

In Eqs. 2-1 and 2-2, h, $2m_{TW}$, $2m_{TB}$, $E_T$, $V_T$ and $n_{TW}$, $n_{TB}$ represent Plank's constant, the effective mass of carriers in the third layer, the effective mass of carriers in the fourth layer, the kinetic energy of the carriers injected into the fourth layer, the potential energy of the fourth layer relative to the third layer, and even numbers, respectively. Carriers injected into the fourth layer preferably exist around the lowest energy of the fourth layer.

An eighth aspect of the present invention is to form a barrier layer between the second quantum-wave interference layer and the emission layer. The barrier layer has an enough thickness which is determined by multiplying an even number one fourth of quantum-wave wavelength of carriers transmitting in the barrier layer.

A ninth aspect of the present invention is to determine the thickness of the emission layer DA which satisfies the formula:

$$D_A=n_A\lambda_A/4=n_Ah/4[2m_A(E_A+V_A)]^{1/2} \qquad (3)$$

In Eq. 3, h, $m_A$, $E_A$, $V_A$, and $n_A$ represent Plank's constant, the effective mass of carriers in the emission layer, the kinetic energy of the carriers injected into a layer which has a wider band gap and is adjacent to the emission layer, the potential energy of the layer which has a wider band gap and is adjacent to the emission layer relative to the emission layer, and an odd number, respectively. Carriers injected into the layer which is formed adjacent to the emission layer are preferably existing around the lowest energy of the emission layer. Here carriers transmit through the layer adjacent to the emission layer when the emission layer has a single layer structure. And when the emission layer has a single quantum well (SQW) structure or a multiple quantum well (MQW) structure, the layers adjacent to the emission layer are barrier layers formed on the both side of the emission layer.

A tenth aspect of the present invention is to provide the first quantum-wave interference layer which functions as a reflection layer of carriers and the second layer which functions as a transmission layer of carriers.

First, Second, Fifth, Seventh, Ninth, and Tenth Aspects of the Present Invention The principle of the first quantum-wave interference layer of the present invention is explained hereinafter. FIG. 1 shows a conduction band of a multiple layer structure with plural periods of a first layer W and a second layer B as. a unit. A band gap of the second layer B is wider than that of the first layer W. Electrons conduct from left to right as shown by an arrow in FIG. 1. Among the electrons, those that exist at the level near the lowest energy level of a conduction band in the second layer B are most likely to contribute to conduction. The electrons near the bottom of conduction band of the second layer B has a kinetic energy E. Accordingly, the electrons in the first layer W have a kinetic energy E+V which is accelerated by potential energy V due to the band gap between the first layer W and the second layer B. In other words, electrons that move from the first layer W to the second layer B are decelerated by potential energy V and return to the original kinetic energy E in the second layer B. As explained above, kinetic energy of electrons in the conduction band is modulated by potential energy due to the multiple layer structure.

When thicknesses of the first layer W and the second layer B are equal to order of quantum-wave wavelength, electrons tend to have characteristics of a wave. The wave length of the electron quantum-wave is calculated by Eqs. 1-1 and 1-2 using kinetic energy of the electron. Further, defining the respective wave number vector of first layer W and second layer B as $K_W$ and $K_B$, reflectivity R of the wave is calculated by:

$$R=(|K_W51-|K_B|)/(|K_W|+|K_B|)$$
$$=[\{m_W(E+V)\}^{1/2}(m_BE)^{1/2}]/[\{m_W(E+V)\}^{1/2}+(m_BE)^{1/2+ee}]$$

$$=[1-\{m_BE/m_W(E+V)\}^{+e,\text{fra }1/2}]/[1+\{m_BE/m_W(E+V)\}^{1/2}] \qquad (4)$$

Further, when $m_B=m_W$, the reflectivity R is calculated by:

$$R=[1-\{E/(E+V)\}^{1/2}]/[1+\{E/(E+V)\}^{1/2+ee}] \qquad (5).$$

When E/(E+V)=x, Eq. 5 is transformed into:

$$R=(1-x^{+e,\text{fra }1/2})/(1+x^{1/2}) \qquad (6).$$

The characteristic of the reflectivity R with respect to the energy ratio x obtained by Eq. 6 is shown in FIG. 2. And when each of the second layer B and the first layer W is laminated S times, the reflectivity $R_S$ of the quantum-wave incident facet is calculated by:

$$R_S=[(1-x^S)/(1+X^S)]^2 \qquad (7)$$

When the condition $x \leq 0.1$ is satisfied, $R \geq 0.52$. Accordingly, the relation between E and V is satisfied with:

$$E \leq V/9 \qquad (8).$$

Since the kinetic energy E of the conducting electrons in the second layer B exists near the bottom of the conduction band, the relation of Eq. 8 is satisfied and the reflectivity R at the interface between the second layer B and the first layer W becomes 52% or more. Consequently, the multiple quantum well layer structure can reflect quantum wave of electrons effectively.

Further, utilizing the energy ratio x enables the thickness ratio $D_B/D_W$ of the second layer B to the first layer W to be obtained by:

$$D_B/D_W = [m_W/(m_B X)]^{1/2} \quad (9).$$

Thicknesses of the first layer W and the second layer B are determined for selectively transmitting one of holes and electrons, because of a difference in potential energy between the valence and the conduction bands, and a difference in effective mass of holes and electrons in the first layer W and the second layer B. Namely, the optimum thickness of the first and the second layers for reflecting electrons is not optimum for reflecting holes. Eqs. 1-1 and 1-2 refer to a structure of the quantum-wave interference layer for reflecting electrons selectively. The thickness for selectively reflecting electrons is designed based on a difference in potential energy of the conduction band and effective mass of electrons. Consequently, the quantum-wave interference layer has a high reflectivity for electrons, but not for holes.

Further, the thickness for selectively reflecting holes is designed based on a difference in potential energy of the valence band and effective mass of holes, realizing another type of quantum-wave interference layer which can reflect holes and transmits electrons.

The principle of the second quantum-wave interference layer of the present invention is explained hereinafter. When thicknesses of the third layer W and the fourth layer B are determined by multiplying an even number by one fourth of a quantum-wave wavelength, for example, a half of a quantum-wave wavelength, a standing wave rises in a quantum-wave interference layer, and a resonant conduction is occurred. That is, when a quantum-wave period of the standing wave and a potential period of the quantum-wave interference layer is corresponded to each other, a scattering of the carrier in each layer is suppressed, and a conduction of a high mobility is realized.

Thicknesses of the third layer W and the fourth layer B are determined for selectively transmitting one of holes and electrons, because of a difference in potential energy between the valence and the conduction bands, and a difference in effective mass of holes and electrons in the third layer W and the fourth layer B. Namely, the optimum thickness of the third and the fourth layers for transmitting electrons is not optimum for transmitting holes. Eqs. 2-1 and 2-2 refer to a structure of the quantum-wave interference layer for transmitting electrons selectively. The thickness for selectively transmitting electrons is designed based on a difference in potential energy of the conduction band and effective mass of electrons. Consequently, the quantum-wave interference layer has a high transmittivity (or a high mobility) for electrons, but not for holes.

Further, the thickness for selectively transmitting holes is designed based on a difference in potential energy of the valence band and effective mass of holes, realizing another type of quantum-wave interference layer as a hole-wave transmission layer, which has a high mobility for holes and which has an ordinary mobility for electrons.

Further explanation can be obtained by FIGS. 3A–3H. FIGS. 3A–3H illustrate the relationship between reflection of quantum-wave of electrons in a potential of quantum-well structure and a period of potential representing a conduction band of a multiple quantum well (MQW). FIGS. 3A–3D show the relationship when the period, i.e., width of the fourth layer B or the third layer W, of the potential is equal to an odd number multiplied by one fourth of the wavelength of propagated election quantum-wave. This type of the potential is named as $\lambda/4$ type potential hereinafter. FIGS. 3E–3H show when the period of the potential is equal to a natural number multiplied by a half of the wavelength of propagated electron quantum-wave. This type of the potential is named as $\lambda/2$ type potential hereinafter. In order to make it visually intelligible, thickness of each layers is unified in FIGS. 3A–3H. Electrons existing around the bottom of a conduction band of the fourth layer B conduct from left to right as shown by an arrow in FIGS. 3A and 3E. And in FIGS. 3B and 3F, the electrons reach the interface between the third layer W and the fourth layer B.

When the quantum-wave of the electrons reaches the interface between the fourth layer B and the third layer W in the $\lambda/4$ type potential, a transmission wave QW2 and a reflection wave QW3 having a phase equal to that of the transmission wave QW2, are generated with respect to an incident wave QW1 as shown in FIG. 3C. Then when the transmission wave QW2 reaches the interface between the third layer W and the fourth layer B, a transmission wave QW4 and a reflection wave QW5 having a phase opposite to that of the transmission wave QW4 are generated as shown in FIG. 3D. The relationship between phases of the transmission wave and the reflection wave at the interface depends on falling or rising of a potential of the conduction band at the interface. In order to make it visually intelligible, each amplitudes of QW1, QW2, QW3, QW4, and QW5 is unified in FIGS. 3A–3H.

With respect to the $\lambda/4$ type potential of the multiple quantum well, the propagating quantum-wave of electrons represented by QW1, QW2 and QW4 and the reflecting quantum-wave of electrons represented by QW3 and QW5 cancels with each other, as shown in FIG. 3D. The quantum-wave of electrons represented by the QW1, QW2 and QW4 propagates from left to right, and the quantum-wave of electrons represented by the QW3 and QW5, generated by the reflection at two interfaces, propagates from right to left. Accordingly, a multiple quantum well, having a potential which is formed in a period, i.e., the width of the third layer W and the fourth layer B, determined by multiplying by an odd number one fourth of quantum-wave wavelength of propagated electrons, cancels the quantum-wave of electrons. In short, the multiple quantum well functions as a reflection layer which does not propagate electrons.

With respect to a multiple quantum well, having a potential which is formed in a period, i.e., the width of the third layer W and the fourth layer B, determined by multiplying by an even number one fourth of quantum-wave wavelength of propagated electrons, i.e., $\lambda/2$ type potential, as shown in FIGS. 3E–3H, the quantum-wave of electrons can become a standing wave.

Similarly, when a quantum-wave of electrons reaches the interface between the fourth layer B and the third layer W in the $\lambda/2$ type potential, a transmission wave QW2 and a reflection wave QW3 having a phase corresponding to that of the transmission wave QW2, are generated with respect to an incident wave QW1 as shown in FIG. 3G. Then when the transmission wave QW2 reaches the interface between the third layer W and the fourth layer B, a transmission wave QW4 and a reflection wave QW5 having a phase opposite to that of the transmission wave QW4 are generated as shown in FIG. 3H. With respect to λ/2 type potential of the multiple quantum well, the propagating quantum-wave of electrons represented by QW1, QW2 and QW4 and the reflecting quantum-wave of electrons represented by QW5 intensifies to each other, as shown in FIG. 3H. On the other hand, the reflection waves QW3 and QW5 can be considered to cancel with each other and the quantum-wave of electrons which is propagated from left to right in FIG. 3E can be a standing wave. Accordingly, with respect to the multiple quantum well, having a potential which is formed in a period, i.e., the width of the third layer W and the fourth layer B, determined by multiplying by an even number one fourth of quantum-wave wavelength of propagated electrons, the quantum-wave of electrons can become a standing wave and a transmission layer having a high transmittivity (or a high mobility) for electrons can be realized.

Alternatively, a multiple quantum well, having a potential which is formed in a period determined by multiplying by a natural number half of quantum-wave wavelength of holes, can be applied to the relationship described above.

A quantum wave optimum to the emission layer is considered hereinbelow. When carriers transmit the emission layer, electron-hole pairs are generated after carriers pass the emission layer, which is not suitable for a light-emitting device. Stable existence of quantum wave may hinder from generating electron-hole pairs. Accordingly, an emission layer preferably has the same structure as either one of the reflection layer and a single layer structure so that it does not transmit quantum wave and in which quantum wave does not exist stably. When the emission layer has a single layer structure, its thickness is determined by multiplying by an odd number one fourth of a wavelength of carriers. When the emission layer has a multiple layer structure, its thickness is preferably determined by multiplying by an odd number one fourth of a wavelength of the layer which has a narrower band gap and which at least generates electron-hole pairs. Here the emission layer is a well layer which is substantially concerned in light emission.

Accordingly, a light-emitting semiconductor device, in which a pair of a first and a second quantum-wave interference layers to one of electrons and holes and an emission layer having a thickness determined by multiplying by an odd number one fourth of quantum-wave wavelength of carriers in the emission layer are formed, is obtained as described above is obtained. When electrons or holes are injected from the second-quantum-wave interference layer to the first quantum-wave interference layer, electrons or holes, which are not interrupted and flows with a high transmittivity in the second quantum-wave interference layer, reach the first quantum-wave interference layer and are reflected effectively, and electron-hole pairs, generated by instable existence of quantum waves in the emission layer, improves luminous efficiency of the device. Accordingly, a light-emitting semiconductor device in the present invention comprising a pair of a first and a second quantum-wave interference layer for electrons or holes and an emission layer enables to considerably improve the efficiency of the device compared with conventional semiconductor devices and has a completely new structure. A light-emitting semiconductor device comprising both a pair of a first and a second quantum-wave interference layers for electrons as carriers and an emission layer is more preferable.

Third and Fourth Aspects of the Present Invention

FIGS. 4–4D illustrate to form a $\delta_R$ layer (disclosed as a δ layer in FIGS. 4A–4D) at the interface between the first layer W and the second layer B. The $\delta_R$ layer has a relatively thinner thickness than both of the first layer W and the second layer B and sharply varies an energy band. By sharply varying the band gap of the interfaces, the potential energy V of an energy band becomes larger substantially and the value x of Eq. 6 becomes smaller, as shown in FIGS. 4A–4D. This is shown in FIGS. 5A–5D. Without forming a $\delta_R$ layer as shown in FIG. 5A, a part of component of the first layer W and the second layer B mixes when the second layer B is laminated on the first layer W, and an energy band gap which varies sharply cannot be obtained, as shown in FIG. 5B. When a $\delta_R$ layer is formed at each interfaces of the first and the second layers as shown in FIG. 5C, even if a part of component of the first layer W and the second layer B mixes, an energy band gap varies sharply compared with the case without $\delta_R$ layers, as shown in FIG. 5D.

Variations are shown in FIGS. 4A to 4D. The $\delta_R$ layer may be formed on both ends of the every first layer W as shown in FIGS. 4A to 4D. In FIG. 4A, the $\delta_R$ layers are formed so that an energy level higher than that of the second layer B may be formed. In FIG. 4B, the $\delta_R$ layers are formed so that a band having lower bottom than that of the first layer W may be formed. In FIG. 4C, the $\delta_R$ layers are formed so that the energy level higher than that of the second layer B and the energy level lower than that of the first layer W may be formed. As an alternative to the variation shown in FIG. 4C, the $\delta_R$ layer can be formed on only either one end of every layer as shown in FIG. 4D.

A $\delta_T$ layer can be formed at the interface between the third layer W and the fourth layer B. The $\delta_T$ layer which has a relatively thinner thickness than both of the third layer W and the fourth layer B and sharply varies an energy band has the same effect as that of the $\delta_R$ layer formed at the interface between the first layer W and the second layer B. The $\delta_T$ layer may be formed in one of a plural quantum-wave interference layers or may be formed in all of the layers.

Sixth and Eighth Aspects of the Present Invention

By forming an enough thickness of barrier layer between the first quantum-wave interference layer and the emission layer, carriers are effectively accumulated in the emission layer. The thickness of the barrier layer is preferably determined by multiplying by an even number one fourth of quantum-wave wavelength of carriers from consideration shown in FIGS. 3A–3H. If the thickness of the barrier layer is determined by multiplying by an odd number one fourth of quantum-wave wavelength of carriers, the barrier layer only reflects carriers and does not inject carriers into the emission layer. Similarly, by forming an enough thickness of barrier layer between the second quantum-wave interference layer and the emission layer, carriers are effectively accumulated in the emission layer. The thickness of the barrier layer is preferably determined by multiplying by an even number one fourth of quantum-wave wavelength of carriers.

FIG. 6 illustrates the structure of forming the barrier layers between the first quantum-wave interference layer and the emission layer and between the second quantum-wave interference layer and the emission layer. Electrons, which function as carriers, conduct from the second quantum-wave interference layer, pass through the emission layer and to the first quantum-wave interference layer. The second quantum-wave interference layer has a thickness determined by multiplying by a half of a quantum-wave wavelength of electrons, and comprises a third and a fourth layers. A barrier layer twice as thick as a quantum-wave wavelength of electrons is formed between the second quantum-wave interference layer and the emission layer. The emission layer has a thickness three-fourths of a quantum-wave wavelength of electrons. A barrier layer twice as thick as a quantum-wave wavelength of electrons is formed between the emission layer and the first quantum-wave interference layer. The first quantum-wave interference layer has a thickness determined by multiplying by one fourth of a quantum-wave wavelength of electrons, and comprises a first and a second layers.

When electrons conduct from the second quantum-wave interference layer to the emission layer, the barrier layer formed between the second quantum-wave interference layer and the emission layer may not reflect but can transmit electrons because it has a thickness twice as large as that of a quantum-wave wavelength of electrons. Then electrons conduct from the emission layer to the first quantum-wave interference layer. Because the barrier layer formed between the emission layer and the first quantum-wave interference layer has a thickness twice as large as a quantum-wave wavelength of electrons, electrons are not reflected by the barrier layer but may be reflected by the first quantum-wave interference layer. Electrons reflected by the first quantum-wave interference layer then transmit the barrier layer having a thickness twice as large as that of a quantum-wave wavelength of electrons and reach the emission layer again. Because the emission layer has a thickness three-fourths of a quantum-wave wavelength of electrons, a quantum-wave of electrons does not become a standing wave but tends to product pairs with holes. Here the emission layer is a well layer substantially concerned in light emission. When the emission layer has a multiple quantum well structure, each well layers functions as an emission layer and barrier layers formed on both sides of layers in the emission layer are the above-described barrier layers.

As another example, as shown in FIG. 7, a plurality of partial quantum-wave interference layers $I_{Rk}$ as the first quantum-wave interference layer, the first electron-wave interference layer or the first hole-wave interference layer may be formed corresponding to each of a plurality of kinetic energy levels $E_{Rk}$. Each of the partial quantum-wave interference layers $I_{Rk}$ has $T_{Rk}$ periods of a first layer W and a second layer B as a unit whose respective thicknesses ($D_{RWk}$, $D_{RBk}$) are determined by following Eqs. 10-1 and 10-2. The plurality of the partial quantum-wave interference layer $I_{Rk}$ is arranged in series with respect to the number k of kinetic energy levels $E_{Rk}$.

$$D_{RWk}=n_{RWk}\lambda_{RWk}/4=n_{RWk}h/4[2m_{RWk}(E_{Rk}+V_R)]^{1/2} \quad (10\text{-}1)$$

and $$D_{RBk}=n_{RBk}\lambda_{RBk}/4=n_{RBk}h/4(2m_{RBk}E_{Rk})^{1/2} \quad (10\text{-}2)$$

That is, the quantum-wave interference layer is formed by a serial connection of $I_{R1}$, $I_{R2}$, . . . and $I_{Rj}$. As shown in FIG. 7, electrons with each of the kinetic energy levels $E_{Rk}$ are reflected by the corresponding partial quantum-wave interference layers $I_{Rj}$. Accordingly, electrons belonging to each of the kinetic energy levels from $E_{R1}$ to $E_{Rj}$ are reflected effectively. By designing the intervals between the kinetic energies to be short, thicknesses of the first layer W and the second layer B ($D_{RWk}$, $D_{RBk}$) in each of the partial quantum-wave interference layers $I_{Rk}$ vary continuously with respect to the value k. Similarly, a plurality of partial quantum-wave interference layers $I_{Tk}$ may be formed corresponding to each of a plurality of kinetic energy levels $E_{Tk}$. Each of the partial quantum-wave interference layers $I_{Tk}$ has $T_{Tk}$ periods of a first layer W and a second layer B as a unit whose respective thicknesses ($D_{TWk}$, $D_{TBk}$) are determined by following Eqs. 11-1 and 11-2. The plurality of the partial quantum-wave interference layer $I_{Tk}$ is arranged in series with respect to the number k of kinetic energy levels $E_{Tk}$. That is, the quantum-wave interference layer is formed by a serial connection of $I_{T1}$, $I_{T2}$, . . . , and $I_{Tj}$. This quantum-wave interference layer becomes to have a high transmittivity (or a high mobility) with carriers.

$$D_{TWk}=n_{TWk}\lambda_{TWk}/4=n_{TWk}h/4[2m_{TWk}(E_{Tk}+V_T)]^{1/2} \quad (11\text{-}1)$$

and $$D_{TBk}=n_{TBk}\lambda_{TBk}/4=n_{TBk}h/4(2m_{TBk}E_{Tk})^{1/2} \quad (11\text{-}2)$$

As shown in FIG. 8, a plurality of partial quantum-wave interference layers may be formed with an arbitrary period as the first quantum-wave interference layer, the first electron-wave interference layer or the first hole-wave interference layer. Each of the partial quantum-wave interference layers $I_{R1}$, $I_{R2}$, . . . is made of serial pairs of the first layer W and the second layer B with widths ($D_{RWk}$, $D_{RBk}$) determined by Eqs. 10-1 and 10-2. That is, the partial quantum-wave interference layer, e.g., $I_{R1}$, is constructed with serial layers of width ($D_{RW1}$, $D_{RB1}$), . . . , ($D_{RWk}$, $D_{RBk}$), . . . , ($D_{RWj}$, $D_{RBj}$). A plurality $I_{R1}$, $I_{R2}$, . . . of layers such as $I_{R1}$ are connected in series to form the total quantum-wave interference layer. Accordingly, electrons of the plurality of kinetic energy levels $E_{Rk}$ are reflected by each pair of layers in each partial quantum-wave interference layers. By designing the intervals between kinetic energies to be short, thicknesses of the pair of the first layer W and the second layer B ($D_{RWk}$, $D_{RBk}$) in a certain partial quantum-wave interference layer $I_{Rk}$ varies continuously with respect to the value k. Similarly, a plurality of partial quantum-wave interference layers, each of which is made of serial pairs of the first layer W and the second layer B with widths ($D_{TWk}$, $D_{TBk}$) determined by Eqs. 11-1 and 11-2, may be formed with an arbitrary period as the second quantum-wave interference layer, the second electron-wave interference layer or the second hole-wave interference layer. That is, the partial quantum-wave interference layer is constructed with serial layers of width ($D_{TW1}$, $D_{TB1}$), . . . , ($D_{TWk}$, $D_{TBk}$), . . . , ($D_{TWj}$, $D_{TBj}$). This quantum-wave interference layer becomes to have a high transmittivity (or a high mobility) with carriers.

BRIEF DESCRIPTION OF THE DRAWINGS

Other objects, features, and characteristics of the present invention will become apparent upon consideration of the following description and the appended claims with reference to the accompanying drawings, all of which form a part of the specification, and wherein reference numerals designate corresponding parts in the various figures, wherein:

DETAILED DESCRIPTION OF THE PREFERRED EMBODIMENTS

The invention will be more fully understood by reference to the following examples.

EXAMPLE 1

Figure 1:
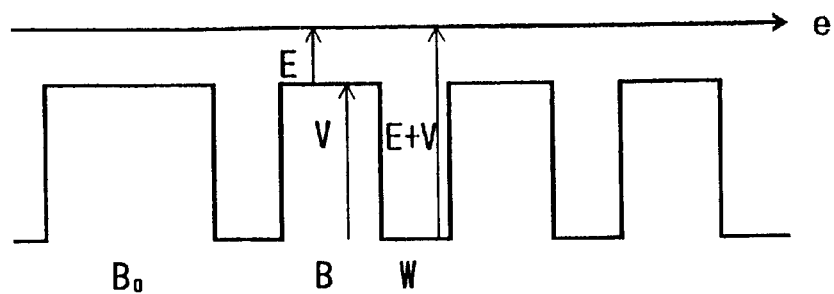
FIG. 1 is an explanatory view of a conduction band of a quantum-wave. interference layer of the present invention.
Figure 2:
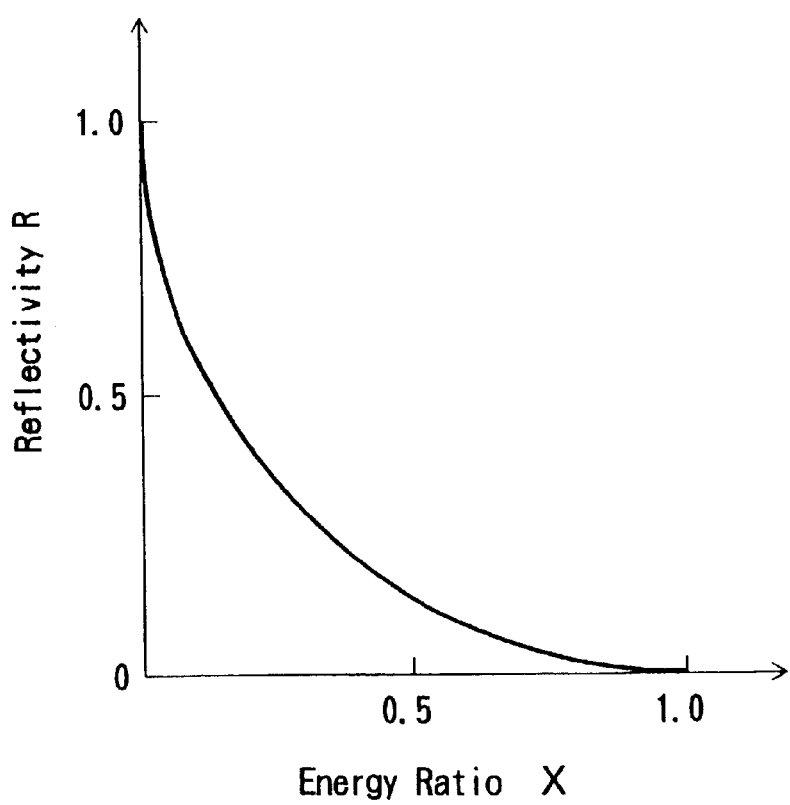
FIG. 2 is a graph. showing a relation between an energy ratio x and a reflectivity R.
Figure 3A:
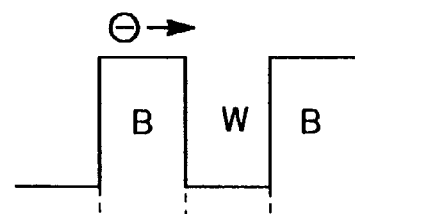
FIGS. 3A–3D are explanatory views of a quantum-wave interference layer as a reflection layer of carriers.
Figure 3B:
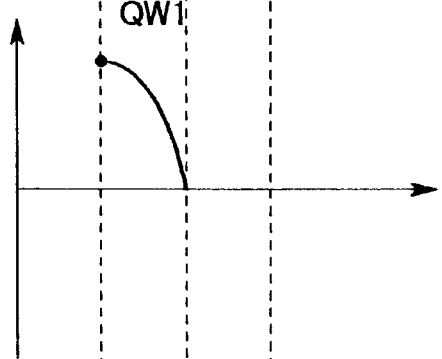
Figure 3C:
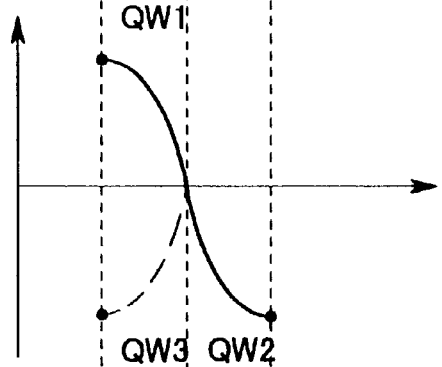
Figure 3D:
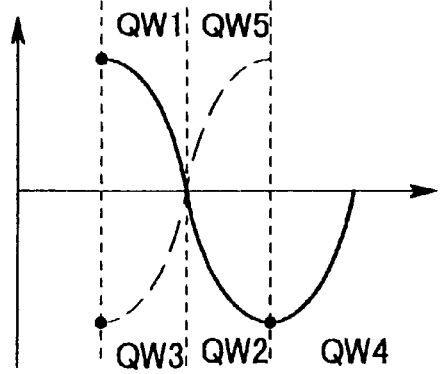
Figure 3E:
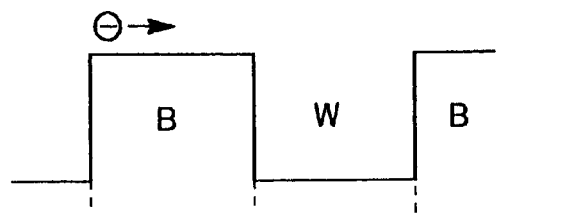
FIGS. 3E–3H are explanatory views of a quantum-wave interference layer as a transmission layer of carriers.
Figure 3F:
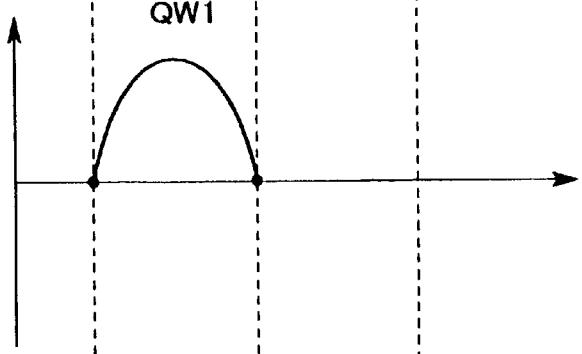
Figure 3G:
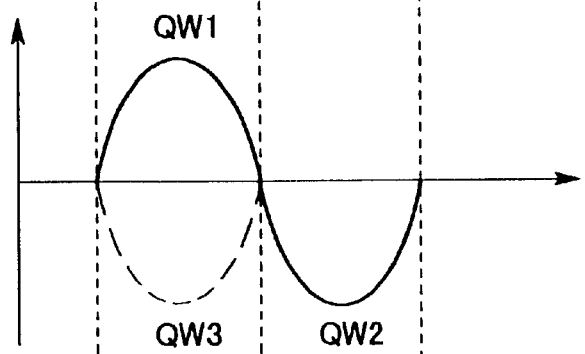
Figure 3H:
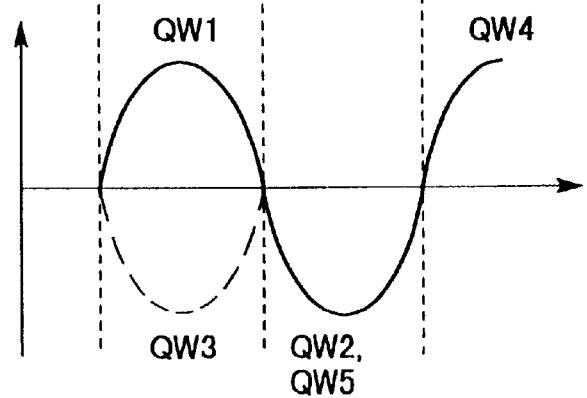
Figure 4A:
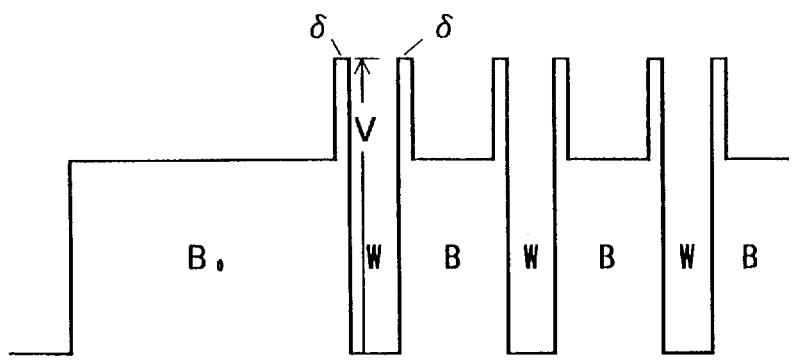
FIGS. 4A–4D are explanatory views of configurations of δ layers according to the present invention.
Figure 4B:
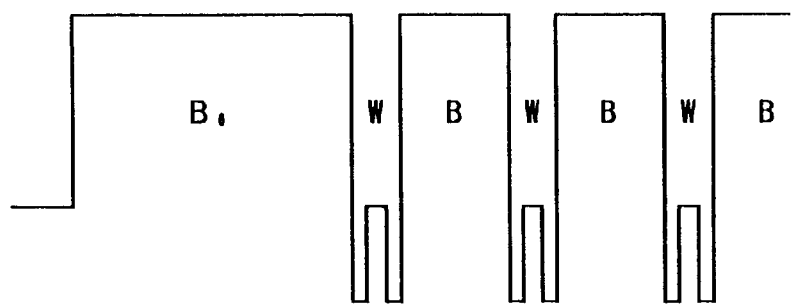
Figure 4C:
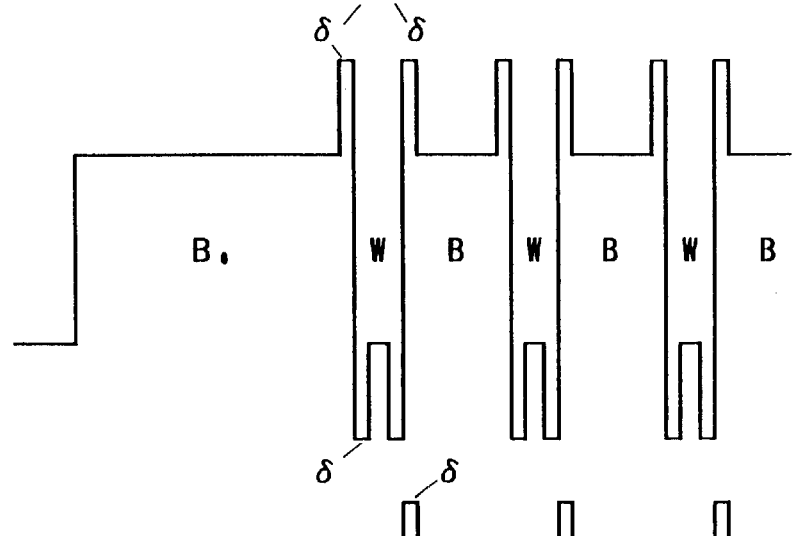
Figure 4D:
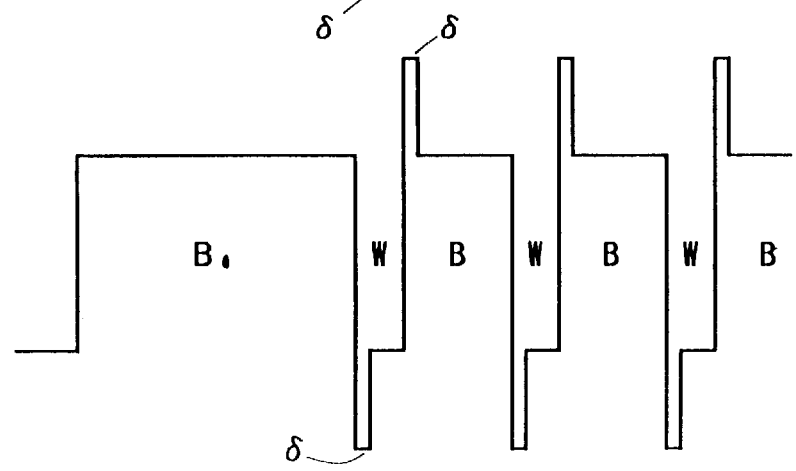
Figure 5A:
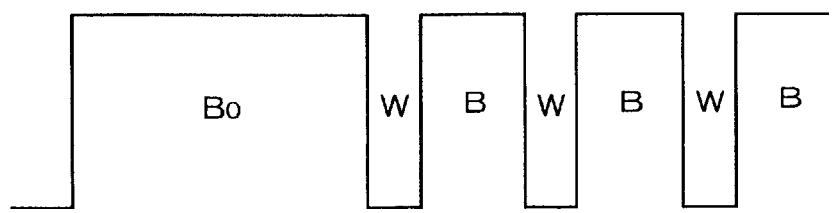
FIGS. 5A–5D are views showing energy level for explaining a function of δ layers according to the present invention.
Figure 5B:
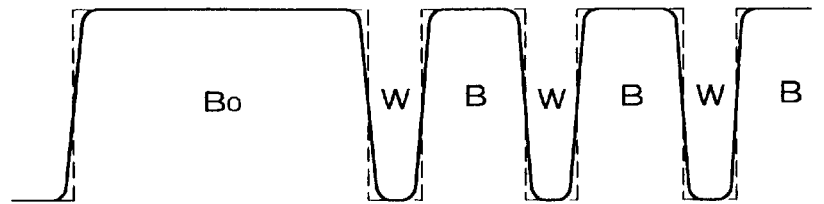
Figure 5C:
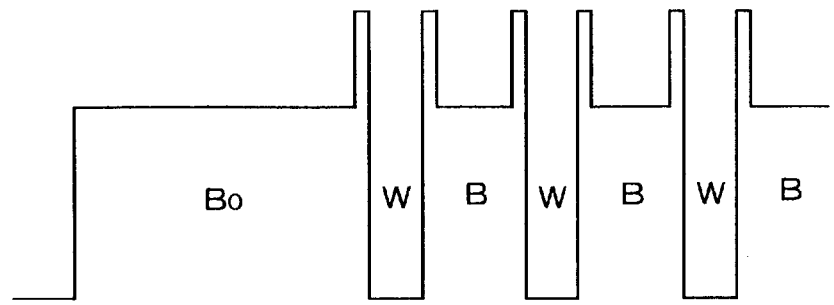
Figure 5D:
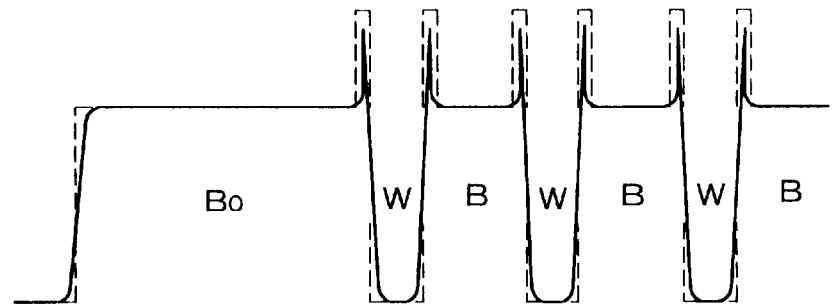
Figure 6:
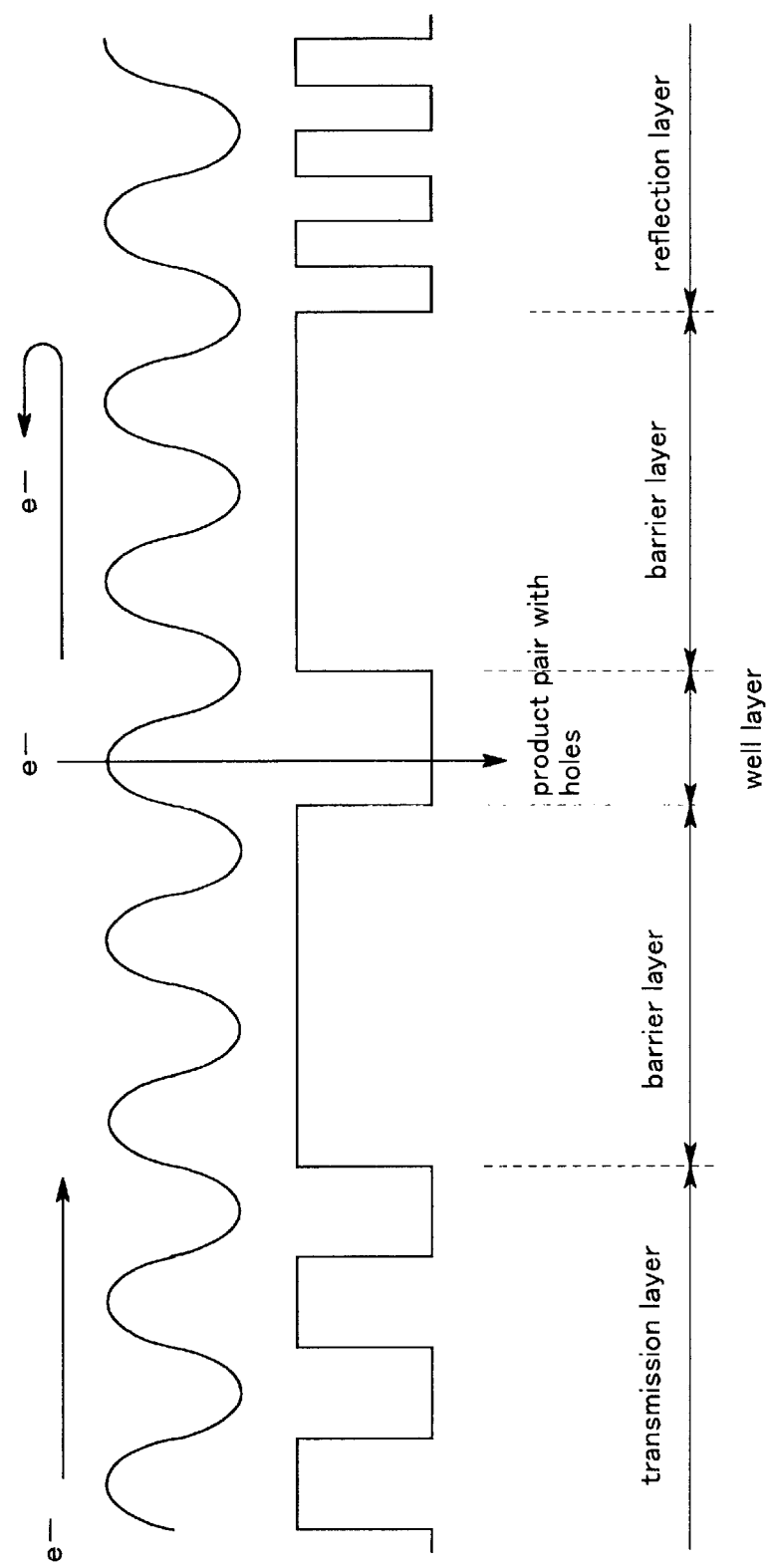
FIG. 6 is an explanatory view showing that electrons tend to be accumulated in an emission layer when an electron transmission layer, an emission layer and an electron reflection layer are formed in the light-emitting semiconductor device of the present invention.
Figure 7:
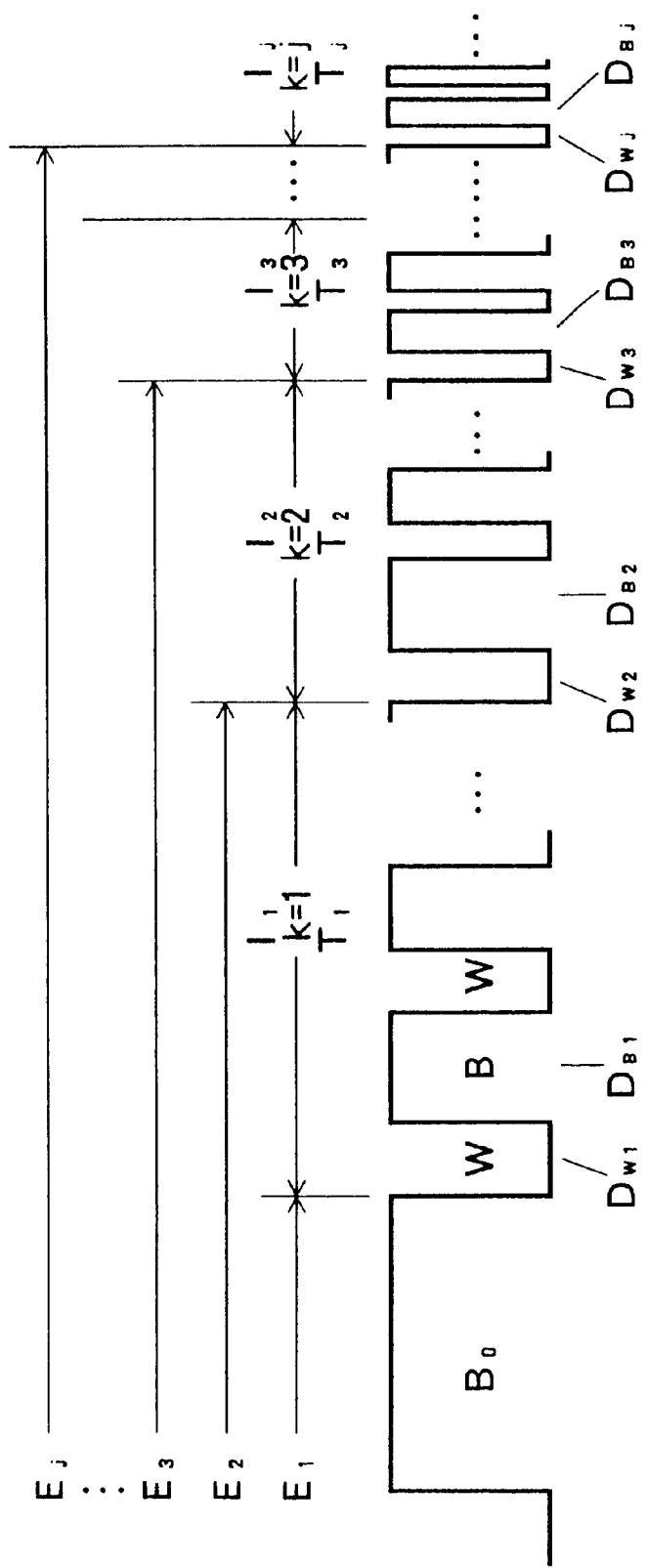
FIG. 7 is an explanatory view of partial quantum-wave interference layers $I_k$ according to another example 1 of the present invention.
Figure 8:
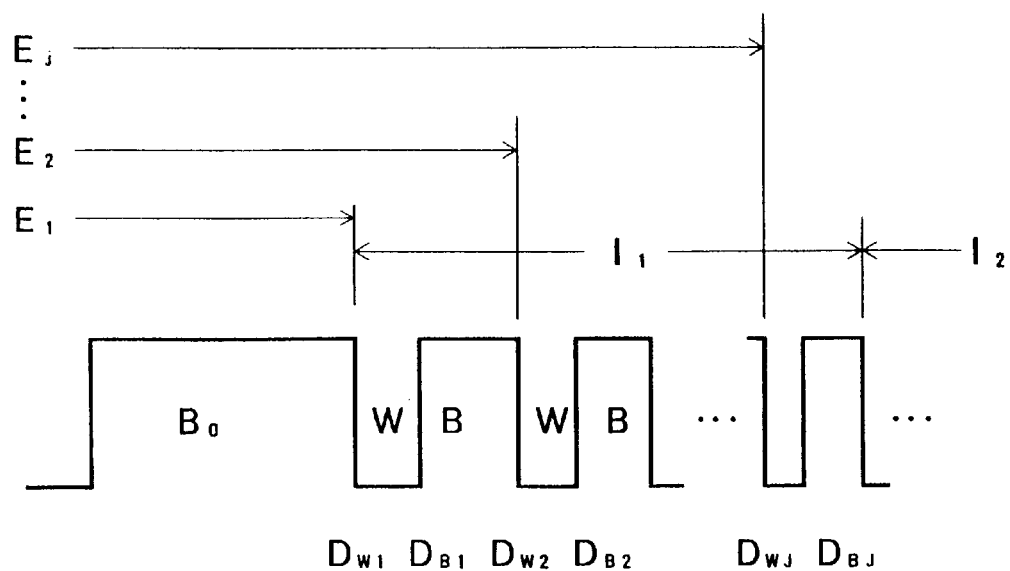
FIG. 8 is an explanatory view of partial quantum-wave interference layers $I_k$ according to another example 2 of the present invention.
Figure 9:
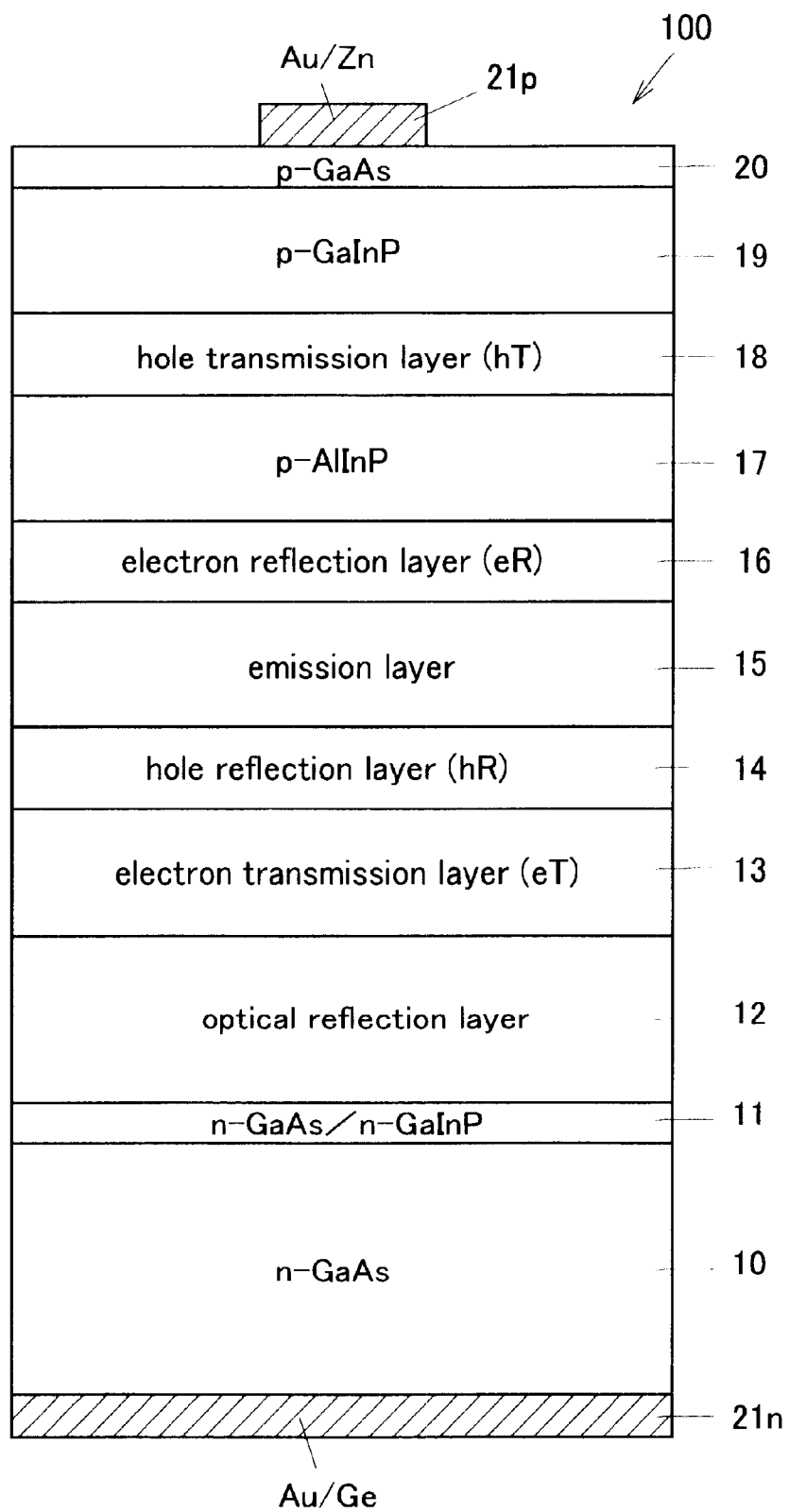
FIG. 9 is a sectional view showing a structure of a light-emitting diode 100 according to the first embodiment of the present invention.

FIG. 9 is a sectional view of a light-emitting diode 100 comprising two quantum-wave interference layers on a p-type layer side, each of which functions as an electron reflection layer and an hole transmission layer, respectively, and two quantum-wave interference layers on an n-type layer side, each of which functions as an electron transmission layer and an hole reflection layer, respectively. The light-emitting diode 100 has a substrate 10 made of gallium arsenide (GaAs). A buffer layer 11 comprising an n-GaAs layer, having a thickness generally of 0.3 $\mu$m and an electron concentration of $2\times10^{18}/cm^3$, and an n-Ga$_{0.5}$In$_{0.5}$P layer, having a thickness generally of 0.2 $\mu$m and an electron concentration of $2\times10^{18}/cm^3$, is formed on the substrate 10. An optical reflection layer 12, which has a thickness of about 2.7 $\mu$m and has a multiple layer structure comprising 25 pairs of an n-Al$_{0.5}$In$_{O.5}$P layer and an n-Ga$_{0.5}$In$_{0.5}$P layer, is formed on the buffer layer 11. The n-Al$_{0.5}$In$_{0.5}$P layer has a thickness of 57 nm and an electron concentration of $2\times10^{18}/cm^3$, and the n-Ga$_{0.5}$In$_{0.5}$P layer has a thickness of 52 nm and an electron concentration of $2\times10^{18}/cm^3$.

An electron transmission layer (eT) 13, which has a thickness of about 0.5 $\mu$m and has a multiple layer structure comprising 20 pairs of an n-Al$_{0.5}$In$_{0.5}$P layer and an n-Ga$_{0.5}$In$_{0.5}$P layer, and 40 Al$_{0.33}$Ga$_{0.33}$In$_{0.33}$P layers formed between each interfaces of the n-Al$_{0.5}$In$_{0.5}$P layer and the n-Ga$_{0.5}$In$_{0.5}$P layer, is formed on the optical reflection layer 12. The n-Al$_{0.5}$In$_{0.5}$P layer has a thickness of 14 nm and an electron concentration of $1\times10^{18}/cm^3$, the n-Ga$_{0.5}$In$_{0.5}$P layer has a thickness of 10 nm and an electron concentration of $1\times10^{18}/cm^3$, and the Al$_{0.33}$Ga$_{0.33}$In$_{0.33}$P layer has a thickness of 1.3 nm.

A hole reflection layer (hR) 14, which has a thickness of about 20 nm and has a multiple layer structure comprising 10 pairs of an n-Al$_{0.5}$In$_{0.5}$P layer and an n-Ga$_{0.5}$In$_{0.5}$P layer, is formed on the electron transmission layer (eT) 13. The n-Al$_{0.5}$In$_{0.5}$P layer has a thickness of 1.2 nm and an electron concentration of $1\times10^{18}/cm^3$, and the n-Ga$_{0.5}$In$_{0.5}$P layer has a thickness of 1.0 nm and an electron concentration of $1\times10^{18}/cm^3$.

An emission 15 having three layer structure is formed on the hole reflection layer (hR) 14. The following three layers are laminated in the emission layer 15 on the hole reflection layer (hR) 14 in sequence: a non-doped i-Al$_{0.5}$In$_{0.5}$P layer having a thickness of 56 nm; a non-doped i-Ga$_{0.3}$In$_{0.7}$P layer having a thickness of 15 nm; and a non-doped i-Al$_{0.5}$In$_{0.5}$P layer having a thickness of 56 nm. The i-Ga$_{0.3}$In$_{0.7}$P layer substantially functions as an emission layer and the i-Al$_{0.5}$In$_{0.5}$P layers function as barrier layers. Accordingly, the emission layer 15 has a single quantum well (SQW) structure, and has a thickness of about 0.13 $\mu$m.

An electron reflection layer (eR) 16, which has a thickness of about 0.3 $\mu$m and has a multiple layer structure comprising 20 pairs of a p-Al$_{0.5}$In$_{0.5}$P layer and a p-Ga$_{0.5}$In$_{0.5}$P layer, and 40 Al$_{0.33}$Ga$_{0.33}$In$_{0.33}$P layers formed between each interfaces of the p-Al$_{0.5}$In$_{0.5}$P layer and the p-Ga$_{0.5}$In$_{0.5}$P layer, is formed on the emission layer 15. The p-Al$_{0.5}$In$_{0.5}$P layer has a thickness of 7 nm and a hole concentration of $1\times10^{18}/cm^3$, the p-Ga$_{0.5}$In$_{0.5}$P layer has a thickness of 5 nm and a hole concentration of $1\times10^{18}/cm^3$, and the Al$_{0.33}$Ga$_{0.33}$In$_{0.33}$P layer has a thickness of 1.3 nm.

A p-cladding layer 17 of p-Al$_{0.5}$In$_{0.5}$P, having a hole concentration of $1\times10^{18}/cm^3$ and a thickness of about 0.4 $\mu$m, is formed on the electron reflection layer (eR) 16. A hole transmission layer (hT) 18, which has a thickness of about 40 nm and has a multiple layer structure comprising 10 pairs of a p-Al$_{0.5}$In$_{0.5}$P layer and a p-Ga$_{0.5}$In$_{0.5}$P layer, is formed on the p-cladding layer 17. The p-Al$_{0.5}$In$_{0.5}$P layer has a thickness of 2.4 nm and a hole concentration of $2\times10^{18}/cm^3$, and the p-Ga$_{0.5}$In$_{0.5}$P layer has a thickness of 2.0 nm and a hole concentration of $2\times10^{18}/cm^3$.

A second p-contact layer 19 of p-Ga$_{0.5}$In$_{0.5}$P, having a hole concentration of $2\times10^{18}/cm^3$ and a thickness of about 25 nm, is formed on the hole transmission layer (hT) 18. A first p-contact layer 20 of p-GaAs, having a hole concentration of $2\times10^{18}/cm^3$ and a thickness of about 60 nm, is formed on the second p-contact layer 19. An electrode layer 21n made of gold and germanium (Au/Ge), having a thickness generally of 0.2 $\mu$m, is formed so as to cover the entire back of the substrate 10. Another electrode layer. 21p made of Au/Zn, having a thickness generally of 0.2 $\mu$m, is formed on some portion of the first p-contact layer 20. And the substrate 10 has a diameter of 2.0 inches and the normal direction of its main surface is offset toward the [011] axis by 15 degree from the (100) plane.

The light-emitting diode 100 was manufactured by gas source molecular beam epitaxial deposition (GS-MBE) which is an epitaxial growth method under extremely high vacuum condition. GS-MBE is different from a conventional MBE which supplies group III and V elements both from solid state sources. In GS-MBE, group III elements such as indium (In), gallium (Ga), and aluminum (Al) are supplied from a solid source and group V elements such as arsenic (As) and phosphorous (P) are supplied by heat decomposition of gas material such as AsH$_3$ and PH$_3$. Alternatively, the light-emitting diode 100 can be manufactured by metal organic chemical vapor deposition (MOCVD).

Japanese Patent Application laid-open No. H10-303406, which has been invented by the inventor of the present invention, discloses an electron reflection layer (eR) 16 having an optimum structure in the light-emitting diode. Thickness of two layers which constitute the electron transmission layer (eT) 13 are twice as large as those of two layers which constitute the corresponding electron reflection layer (eR) 16. Thickness of two i-Al$_{0.5}$In$_{0.5}$P layers, which constitute the emission layer 15 and sandwich the layer having a single quantum well (SQW) structure, are fourfold and eightfold of those of the n-Al$_{0.5}$In$_{0.5}$P layer constituting the-electron transmission layer (eT) 13 and the p-Al$_{0.5}$In$_{0.5}$P layer constituting the electron reflection layer (eR) 16, respectively, and twice as large as that of a quantum wavelength of electron.

Figure 10:
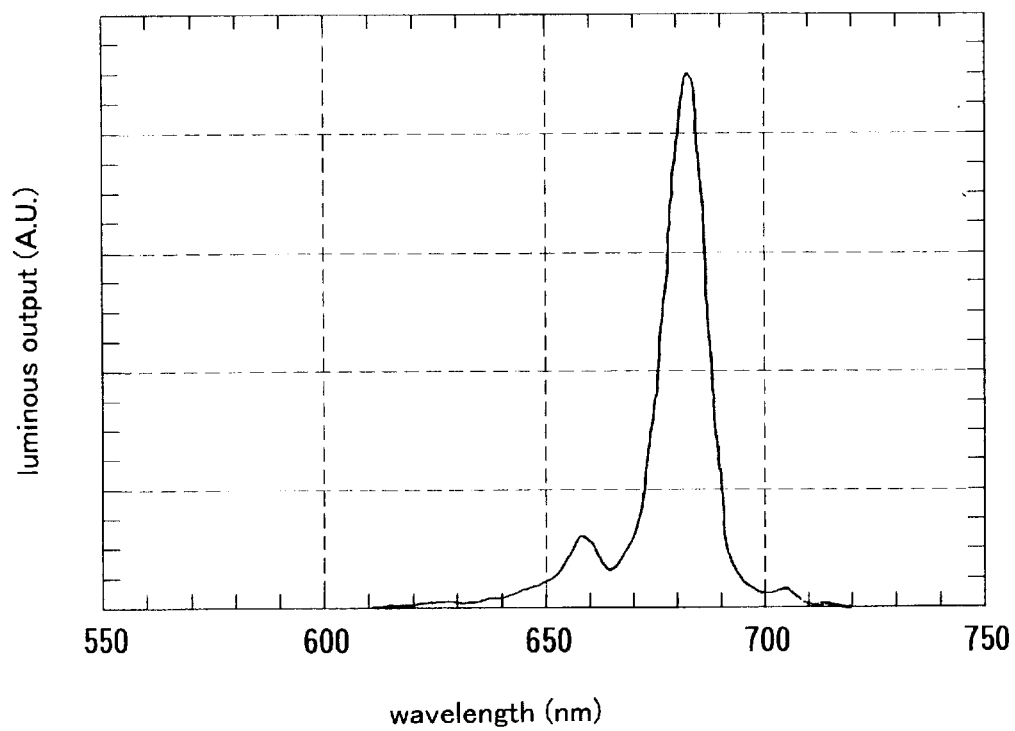
FIG. 10 is a graph showing luminous characteristics of the light-emitting diode 100 according to the first embodiment of the present invention.

FIG. 10 is a graph showing luminous characteristics of the light-emitting diode 100. A luminous wavelength was 682 nm and half-width was 10 nm.

Figure 11:
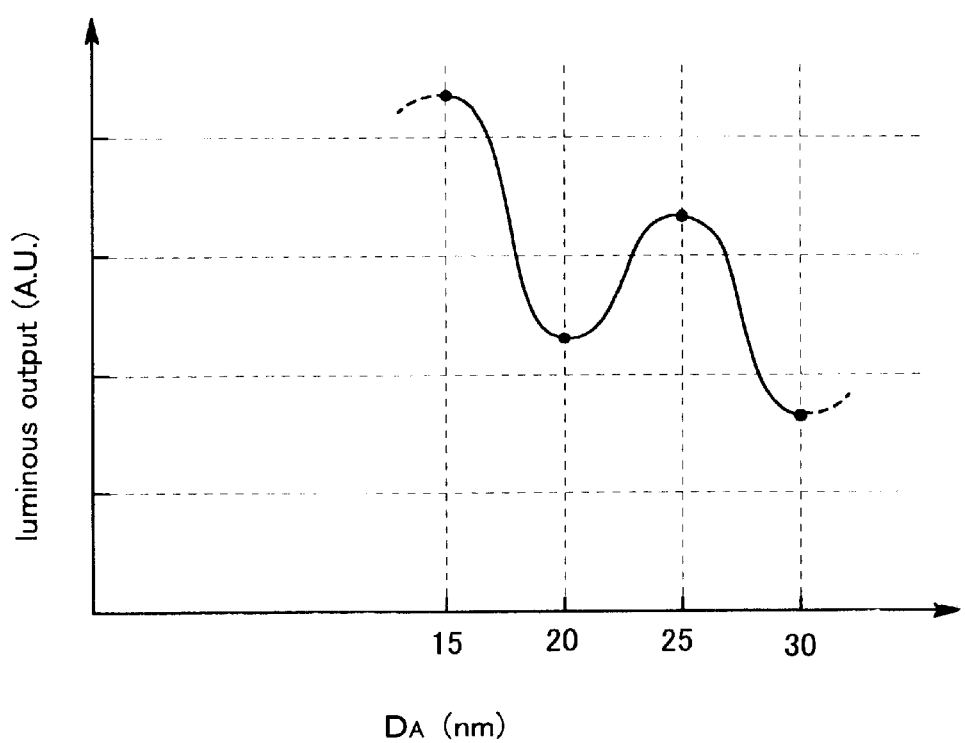
FIG. 11 is a view showing a relationship between a thickness of the emission layer DA and a luminous efficiency of the emission layer according to the present invention.

Luminous outputs were measured by varying the thickness $D_A$ of the i-$Ga_{0.3}In_{0.7}P$ well layer of the emission layer 15 as 15 nm, 20 nm, 25 nm, and 30 nm. FIG. 11 illustrates a graph of the luminous outputs, which varies periodically in accordance with the thickness $D_A$ of the i-$Ga_{0.3}In_{0.7}P$ well layer of the emission layer 15. When the thickness $D_A$ of the i-$Ga_{0.3}In_{0.7}P$ well layer is 15 nm, the luminous output is larger than that when the thickness $D_A$ of the i-$Ga_{0.3}In_{0.7}P$ well layer is 20 nm. When the thickness $D_A$ of the i-$Ga_{0.3}In_{0.7}P$ well layer is 25 nm, the luminous output is larger than that when the thickness $D_A$ of the i-$Ga_{0.3}In_{0.7}P$ well layer is 20 nm or 30 nm. The i-$Ga_{0.3}In_{0.7}P$ well layer is a non-doped layer, and its band gap energy is almost same as that of the p-$Ga_{0.5}In_{0.5}P$ layer in the electron reflection layer (eR) 16. As a result, luminous efficiency of the emission layer 15 is, similar to that of the electron reflection layer eR, 16 improved according to a thickness multiplying a quantum wavelength of electrons by an odd number.

In the above embodiment, two quantum-wave interference layers are formed for electrons in the light-emitting diode 100. The quantum-wave interference layers function as the electron reflection layer (eR) 16 and the electron transmission layer (eT) 13. Two quantum-wave interference layers for holes are also formed in the light-emitting diode 100, which function as the hole reflection layer (hR) 14 and the hole transmission layer (hT) 18. And the emission layer 15 is formed between the two pairs of the two quantum-wave interference layers. Alternatively, the structure of the light-emitting diode 100 is not limited to this embodiment. For example, the hole reflection layer (hR) 14 and the hole transmission layer (hT) 18 are not necessarily needed. Further alternatively, a diode can be formed to comprise the hole reflection layer (hR) 14 and the hole transmission layer (hT) 18, and not to comprise the electron reflection layer (eR) 16 and the electron transmission layer (eT) 13. Forming a reflection layer and a transmission layer for electrons and forming a reflection layer for holes can be applied to the light-emitting diode of the present invention. And arbitrary combinations of quantum-wave interference layers can be applied to the diode of the present invention. Because electrons have larger mobility in a semiconductor. compared with holes, forming a pair of quantum-wave interference layers as an electron transmission layer and an electron reflection layer, respectively, is more preferable and improves effectivity of a light-emitting diode as in the present invention.

In the above embodiment, a diode with δ layers are shown. Band gap energy at a potential interface varies sharply and interference effect of quantum-wave is more improved by δ layers. Alternatively, a multiple quantum well (MQW) structure without a δ layer can be applied to a device although its effect will be lowered.

Further, in the above embodiment, a layer having a multiple period structure and the δ layer was made of ternary compounds including $Ga_{0.5}In_{0.5}P/Al_{0.5}In_{0.5}P$ and quaternary compounds including $Al_{0.33}Ga_{0.33}In_{0.33}P$, respectively. Alternatively, the layer having a multiple period structure and a δ layer can be made of binary, ternary and quaternary compounds such as $Al_xGa_yIn_{1-x-y}P$ or $Al_xGa_yIn_{1-x-y}As$, selecting arbitrary composition ratio within the range of $0 \leq x \leq 1$, $0 \leq y \leq 1$, and $0 \leq x+y \leq 1$.

In the above embodiment, the emission layer has a single quantum well (SQW) structure and is sandwiched by the barrier layers. Alternatively, the barrier layers are not necessarily formed and the emission layer having a single layer structure can be formed adjacent to quantum-wave interference layers. Further alternatively, the emission layer having a multiple quantum well (MQW) structure can be formed by forming a well layer in the emission layer, substantially function as an emission layer, to have a thickness determined by multiplying by an odd number one fourth of quantum-wave wavelength of carriers.

In the present invention, a light-emitting diode was used to show the effectivity of this invention. Alternatively, forming either pair of a reflection layer and a transmission layer for electrons or holes or forming all of them is not necessarily limited to a light-emitting diode, and can be applied to an arbitrary semiconductor device such as a photodiode, a light-receiving device (e.g., a solar battery), and so on.

As another alternative, the layer having a multiple period structure can be made of multi-junction of hetero-material such as group III-V compound semiconductor, group II–VI compound semiconductors, Si and Ge, and hetero-semiconductor. The desirable compositions are as follows. Each combinations is represented by a composition of a layer having a wide bandwidth/a layer having a narrow bandwidth//a substrate. And x and y are arbitrary values wherein $0 \leq x \leq 1$ and $0 \leq y \leq 1$, as long as they are not specified. The combinations of desirable compositions shown below are one of optimum examples for a device, and the present invention can be applied to a semiconductor device comprising semiconductor layers of an arbitrary composition.

<1> $Al_xIn_{1-x}P/Ga_yIn_{1-y}P//GaAs$

<2> $Al_xGa_{1-x}As/GaAs//GaAs$

<3> $Ga_xIn_{1-x}P//InP//InP$

<4> $Ga_xIn_{1-x}P/Ga_xIn_{1-x}As//GaAs$

<5> $AlAs/Al_xGa_{1-x}As//GaAs (0.8 \leq x \leq 0.9)$

<6> $InP/Ga_xIn_{1-x}As_yP_{1-y}GaAs$

<7> $Si/SiGe_x//arbitrary\ material\ (0.1 \leq x \leq 0.3)$

<8> $Si/SiGe_xC_y//arbitrary\ material\ (0.1 \leq x \leq 0.3, 0 < y \leq 0.1)$

<9> $Al_{x1}Ga_{y1}In_{1-x1-y1}N/Al_{x2}Ga_{y2}In_{1-x2-y2}N//Si, SiC,$ GaN, or sapphire $(0 \leq x_1, x_2, y_1, y_2, x_1+y_1, x_2+y_2 \leq 1)$.

In a semiconductor of hetero-material having the above 9 combinations of compositions, doping arbitrary impurities, or adding dopants into the hetero-material to control the conduction type and resistivity, can be applied to the present invention. Alternatively, a part of the composition elements can be replaced with other elements in the same group. For example, a part of group III composition elements such as Al, Ga and In can be replaced with other group III elements, e.g., B and Tl. Also a part of group V composition elements such as P and As can be replaced with other group V elements, e.g., N, Sb, and Bi.

While the invention has been described in connection with what are presently considered to be the most practical and preferred embodiments, it is to be understood that the invention is not to be limited to the disclosed embodiments, but on the contrary, the description is intended to cover various modifications and equivalent arrangements included within the spirit and scope of the appended claims. The present document claims the benefit of Japanese priority document, filed in Japan on Sep. 29, 1999, the entire contents of which is incorporated herein by reference.

Obviously, numerous modifications and variations of the present invention are possible in light of the above teachings. It is therefore to be understood that within the scope of the appended claims, the invention may be practiced otherwise than as specifically described herein.

What is claimed is:

1. A light-emitting semiconductor device comprising:
   a first quantum-wave interference layer having plural periods of a pair of a first layer and a second layers, said second layer having a wider band gap than said first layer;
   a second quantum-wave interference layer having plural periods of a pair of a third layer and a fourth layers, said fourth layer having a wider band gap than said third layer; and
   an emission layer formed between said first quantum-wave interference layer and said second quantum-wave, interference layer;
   wherein each thickness of said first and said second layers in said first quantum-wave interference layer is determined by multiplying by an odd number one fourth of quantum-wave wavelength of carriers in each of said first and said second layers, each thickness of said third and said fourth layers in said second quantum-wave interference layer is determined by multiplying by an even number one fourth of quantum-wave wavelength of carriers in each of said third and fourth layers, and the thickness of said emission layer is determined by multiplying by an odd number one fourth of quantum-wave wavelength of carriers in said emission layer.

2. A light-emitting semiconductor device according to claim 1, wherein each thickness of said first and said second layers in said first quantum-wave interference layer is determined by multiplying by an odd number one fourth of quantum-wave wavelength of carriers in each of said first and said second layers existing at a level near the lowest energy level of said second layer, each thickness of said third and fourth layers in said second quantum-wave interference layer is determined by multiplying by an even number one fourth of quantum-wave wavelength of carriers in each of said third and fourth layers existing at a level near the lowest energy level of said fourth layer, and the thickness of said emission layer is determined by multiplying by an odd number one fourth of quantum-wave wavelength of carriers in said emission layer existing at the level near the lowest energy level of a layer which has a wider band gap and is adjacent to said emission layer.

3. A light-emitting semiconductor device according to claim 1 comprising:
   a $\delta_R$ layer for sharply varying energy band, being formed between said first and said second layers, wherein said $\delta_R$ layer is substantially thinner than that of said first and said second layers.

4. A light-emitting semiconductor device according to claim 1 comprising:
   a $\delta_T$ layer for sharply varying energy band, being formed between said third and said fourth layers, wherein said $\delta_T$ layer is substantially thinner than that of said third and said fourth layers.

5. A light-emitting semiconductor device according to claim 1, wherein said wavelength $\lambda_{RW}$ in said first layer is determined by a formula $\lambda_{RW}=h/[2m_{RW}(E_R+V_R)]^{1/2}$, said wavelength $\lambda_{RB}$ in said second layer is determined by a formula $\lambda_{RB}=h/(2m_{RB}E_R)^{1/2}$, said thickness of said first layer $D_{RW}$ is determined by a formula $D_{RW}=n_{RW}\lambda_{RW}/4$, and said thickness of said second layer $D_{RB}$ is determined by a formula. $D_{RB}=n_{RB}\lambda_{RB}/4$, where h, $m_{RW}$, $m_{RB}$, $E_R$, $V_R$, and $n_{RW}$ and $n_{RB}$ represent a Plank's constant, effective mass of said carrier in said first layer, effective mass of said carrier in said second layer, kinetic energy of carriers at the level near the lowest energy level in said second layer, potential energy of said second layer to said first layer, and odd numbers, respectively.

6. A light-emitting semiconductor device according to claim 1, further comprising:
   a barrier layer formed between said first quantum-wave interference layer and said emission layer, wherein said barrier layer has an enough thickness which is determined by multiplying an even number one fourth of quantum-wave wavelength of carriers transmitting in said barrier layer.

7. A light-emitting semiconductor device according to claim 1, wherein said wavelength $\lambda_{TW}$ in said third layer is determined by a formula $\lambda_{TW}=h/[2m_{TW}(E_T+V_T)]^{1/2}$, said wavelength $\lambda_{TB}$ in said fourth layer is determined by a formula $\lambda_{TB}=h/(2m_{TB}E_T)^{1/2}$, said thickness of said third layer $D_{TW}$ is determined by a formula $D_{TW}=n_{TW}\lambda_{TW}/4$, and said thickness of said fourth layer $D_{TB}$ is determined by a formula $D_{TB}=n_{TB}\lambda_{TB}/4$, where h, $m_{TW}$, $m_{TB}$, $E_T$, $V_T$, and $n_{TW}$ and $n_{TB}$ represent a Plank's constant, effective mass of said carrier in said third layer, effective mass of said carrier in said fourth layer, kinetic energy of carriers at the level near the lowest energy level in said fourth layer, potential energy of said fourth layer to said third layer, and even numbers, respectively.

8. A light-emitting semiconductor device according to claim 1, further comprising:
   a barrier layer formed between said second quantum-wave interference layer and said emission layer, wherein said barrier layer has an enough thickness which is determined by multiplying an even number one fourth of quantum-wave wavelength of carriers transmitting in said barrier layer.

9. A light-emitting semiconductor device according to claim 1, wherein said quantum-wave wavelength $\lambda_A$ is determined by the formula $\lambda_A=h/[2m_A(E_A+V_A)]^{1/2}$, and the thickness of said emission layer $D_A$ is determined by the formula $D_A=n_A\lambda_A/4$, where h, $m_A$, $E_A$, $V_A$, and $n_A$ represent Plank's constant, the effective mass of carriers in said emission layer, the kinetic energy of the carriers injected into a layer which has a wider band gap and is adjacent to said emission layer, the potential energy of the layer which has a wider band gap and is adjacent to said emission layer relative to said emission layer, and an odd number, respectively.

10. A light-emitting semiconductor device according to claim 1, wherein said first quantum-wave interference layer functions as a reflection layer of said carriers and said second quantum-wave interference layer functions as a transmission layer of said carriers.

* * * * *